United States Patent
Lai et al.

(10) Patent No.: US 10,763,197 B2
(45) Date of Patent: Sep. 1, 2020

(54) ELECTRONIC APPARATUS AND CIRCUIT BOARD THEREOF

(71) Applicant: REALTEK SEMICONDUCTOR CORP., Hsinchu (TW)

(72) Inventors: Chao-Min Lai, Hsinchu (TW); Hung-Wei Wang, Hsinchu (TW); Ping-Chia Wang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/371,378

(22) Filed: Apr. 1, 2019

(65) Prior Publication Data
US 2019/0385941 A1    Dec. 19, 2019

(30) Foreign Application Priority Data

Jun. 13, 2018   (TW) .............................. 107120365 A

(51) Int. Cl.
| | |
|---|---|
| *H01L 29/40* | (2006.01) |
| *H01L 21/44* | (2006.01) |
| *H01L 23/498* | (2006.01) |
| *H01L 23/00* | (2006.01) |

(52) U.S. Cl.
CPC .. *H01L 23/49816* (2013.01); *H01L 23/49827* (2013.01); *H01L 24/14* (2013.01); *H01L 24/17* (2013.01); *H01L 2924/15311* (2013.01)

(58) Field of Classification Search
CPC .......................... H01L 23/49816; H01L 24/14
USPC ........................... 438/612, 613; 257/779, 780
See application file for complete search history.

(56) References Cited

U.S. PATENT DOCUMENTS

| | | | | |
|---|---|---|---|---|
| 6,384,476 | B2 * | 5/2002 | Takeuchi .............. | H01L 23/642 257/691 |
| 6,740,965 | B2 * | 5/2004 | Hsu ................... | H01L 23/49838 257/692 |
| 7,372,170 | B2 * | 5/2008 | Pendse .................... | H01L 23/50 257/787 |
| 7,602,615 | B2 * | 10/2009 | Chan .................... | H05K 1/0231 174/261 |
| 9,609,749 | B2 * | 3/2017 | Chang .................... | H01L 24/16 174/262 |
| 2006/0170093 | A1 | 8/2006 | Pendse | |
| 2011/0110061 | A1 | 5/2011 | Leung | |

FOREIGN PATENT DOCUMENTS

| | | |
|---|---|---|
| TW | 200522237 A | 7/2005 |
| TW | 201132265 A1 | 9/2011 |

* cited by examiner

*Primary Examiner* — Calvin Lee
(74) *Attorney, Agent, or Firm* — Li & Cai Intellectual Property (USA) Office

(57) ABSTRACT

An electronic apparatus and a circuit board thereof are provided. The electronic apparatus includes a control device that can operate with the circuit board, and includes a ball pad array. The ball pad array includes a plurality of power ball pads and a plurality of ground ball pads, which are arranged in the same pad arrangement region. At least a portion of the power ball pads and at least a portion of the ground ball pads are arranged in an alternate manner. The circuit board includes a solder pad array corresponding to the ball pad array of the control device so as to be disposed with the control device.

18 Claims, 10 Drawing Sheets

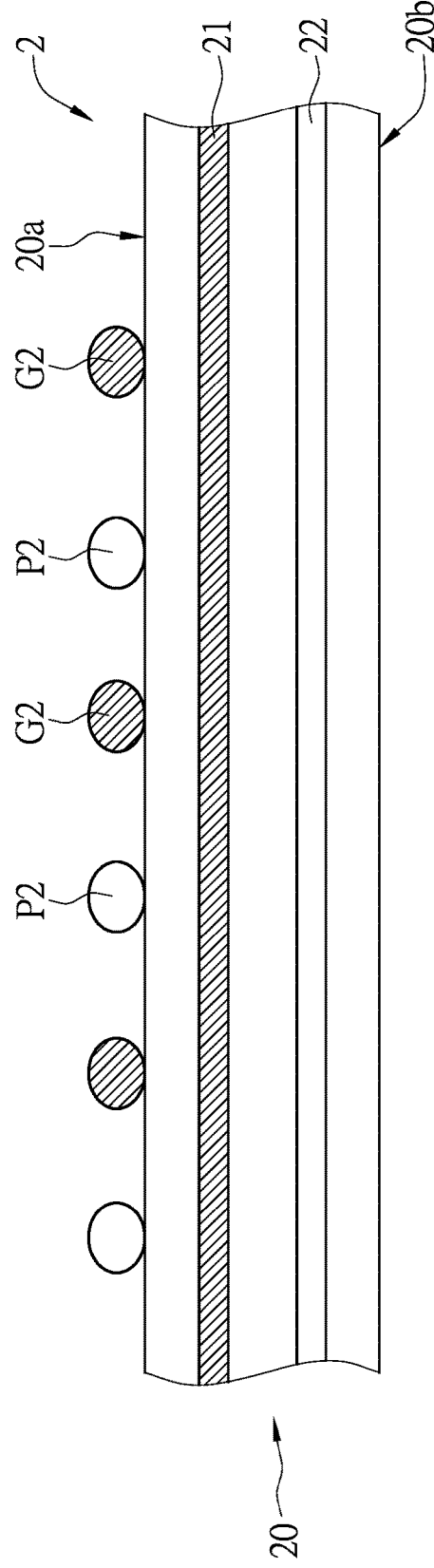
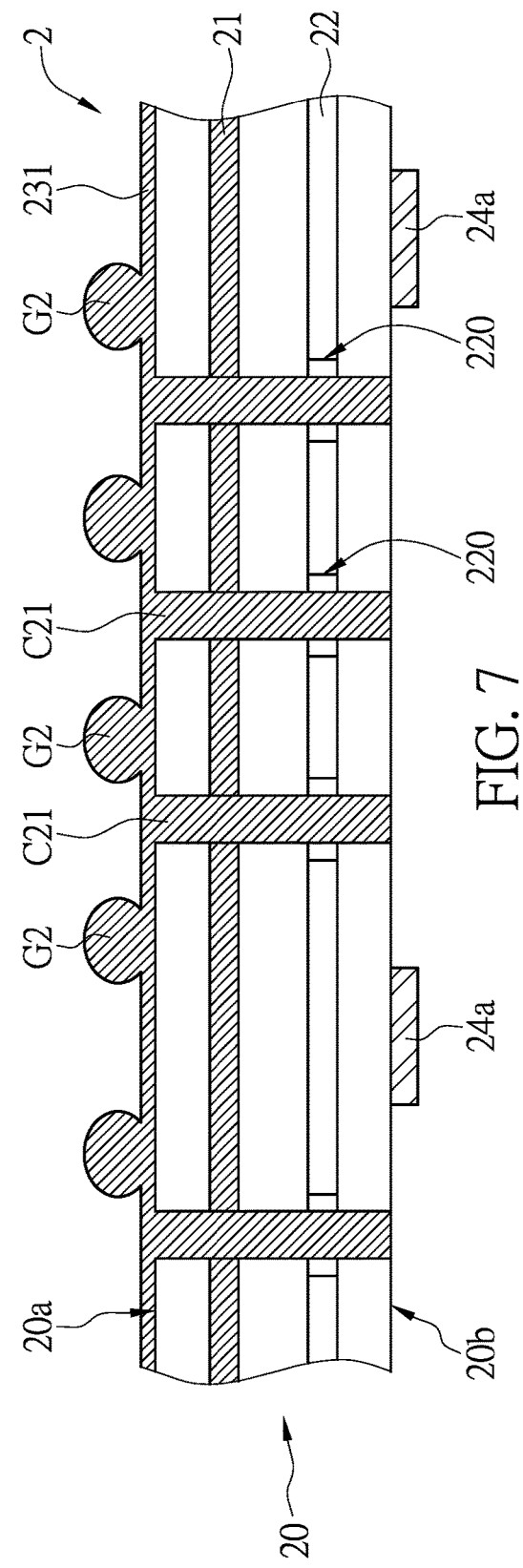
FIG. 6
FIG. 7

ELECTRONIC APPARATUS AND CIRCUIT BOARD THEREOF

CROSS-REFERENCE TO RELATED PATENT APPLICATION

This application claims the benefit of priority to Taiwan Patent Application No. 107120365, filed on Jun. 13, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic apparatus and a circuit board thereof, and more particularly to an electronic apparatus including a control device with a ball grid array and a circuit board for operation with the control device.

BACKGROUND OF THE DISCLOSURE

A technique of ball grid array package has been widely used to package integrated circuit chips (IC chips) to form IC components. In a ball grid array package, a solder ball array is formed at the bottom of a package substrate of an IC component, and the solder balls can serve as contacts so that the IC component can be electrically connected to a printed circuit board. Furthermore, signal transmission between the IC chip and the printed circuit board can be established through the solder balls of the solder ball array.

Currently, in the designs of the printed circuit board and the ball grid array, ground balls are electrically connected to a ground plane of the printed circuit board respectively through ground vias, and power balls are electrically connected to a power plane of the printed circuit board respectively through power vias.

In order to reduce voltage drop (or IR drop) due to parasitic resistance of the printed circuit board, the numbers of the ground balls and the power balls are increased as much as possible so as to increase current paths. Accordingly, the numbers of the ground vias and the power vias are increased with the increasing numbers of the ground balls and the power balls, such that the arrangements of the ground vias and the power vias become denser. In addition, the conventional ground and power balls are respectively arranged in different regions to simplify the fabrication of wiring layers of the printed circuit board.

However, parasitic inductance would be easily generated among the ground vias (or the power vias) which are closely arranged. Since transient current variation and parasitic inductance that are generated during the operation of the IC component may result in simultaneous switching noise (SSN) in the circuit, the supply voltage of the IC component would be decreased.

With increasing demand for higher operating efficiency of the IC component, the IC component switches from a low power state to a high power state in a few nanoseconds, and the supply current of the IC component is significantly increased within a very short period of time. The significant increase of the transient current variation magnifies the negative effect caused by the parasitic inductance. That is to say, voltage drop of the supply voltage is increased with the significant increase of the transient current variation and the existence of the parasitic inductance. As such, the power integrity would be reduced, thereby decreasing the operating stability of the electronic device.

SUMMARY OF THE DISCLOSURE

In response to the above-referenced technical inadequacies, the present disclosure provides a control device with a ball pad array and a circuit board used in cooperation with the control device so that parasitic inductance that is generated in the circuit of the circuit board can be reduced, and voltage drop due to the significant increase of the transient current variation can be attenuated.

In one aspect, the present disclosure provides a control device including a ball pad array disposed at a bottom thereof. The ball pad array includes a plurality of power ball pads and a plurality of ground ball pads, the power ball pads and the ground ball pads are arranged in the same pad arrangement region, and at least a portion of the ground ball pads and at least a portion of the power ball pads are arranged in an alternate manner.

In one aspect, the present disclosure provides a circuit board including a laminated board and a solder pad array. The laminated board has a first surface and a second surface opposite to the first surface. The laminated board includes a ground layer and a power layer which are insulated from each other. The solder pad array is disposed on the first surface and includes a plurality of power solder pads electrically connected to the power layer and a plurality of ground solder pads electrically connected to the ground layer. The power solder pads and the ground solder pads are jointly arranged in a first predetermined region of the first surface, and a portion of the ground solder pads and a portion of the power solder pads are arranged in an alternate manner.

Therefore, one of the advantages of the present disclosure is that by, at least, a technique of "at least a portion of the power pads and at least a portion of the ground pads being arranged in an alternate manner," the parasitic inductance generated in the circuit board can be reduced, thereby avoiding too larger voltage variation resulted from the significant increase of the transient current variation when the control device is operating in high frequency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 6 is a partial cross-sectional view of the circuit board taken along line VI-VI of FIG. 4.

FIG. 7 is a partial cross-sectional view of the circuit board taken along line VII-VII of FIG. 4.

DETAILED DESCRIPTION OF THE EXEMPLARY EMBODIMENTS

Figure 1:
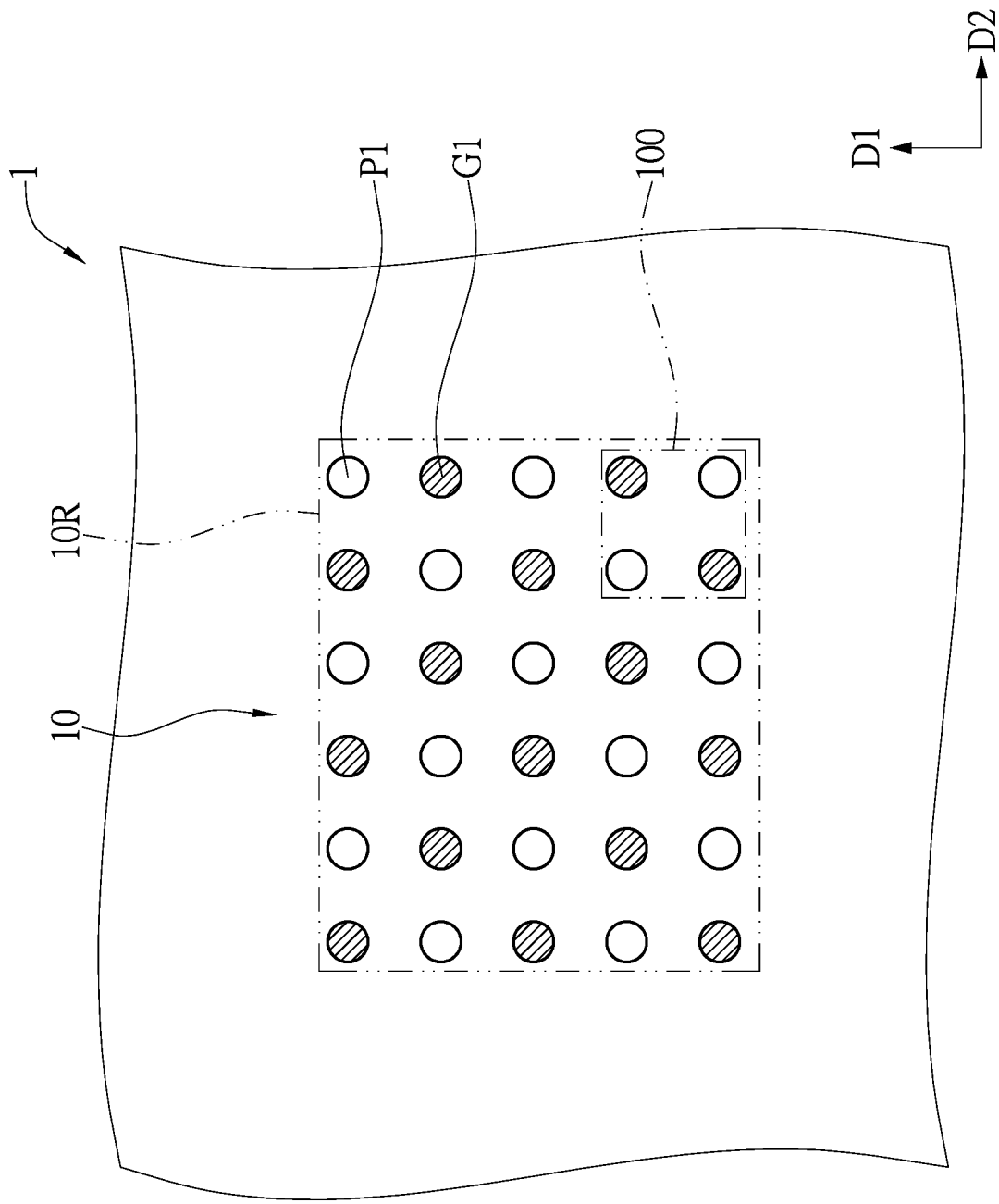
FIG. 1 is a partial view of the bottom of a control device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which shows a partial view of the bottom of a control device according to an embodiment of the present disclosure. A control device 1 is used to be assembled with a circuit board to form an electronic apparatus. Furthermore, the control device 1 can operate with the circuit board.

The control device 1 can be a central processing unit (CPU) or a graphic processing unit (GPU), which can be a package structure of a system on chip (SoC). Furthermore, the control device 1 can operate at a high frequency.

The control device 1 includes a ball pad array 10 disposed at a bottom side thereof, and the ball pad array 10 includes a plurality of power ball pads P1 and a plurality of ground ball pads G1. It should be noted that in the embodiment of the present disclosure, the arrangements of the power ball pads P1 and the ground ball pads G1 of the ball pad array 10 are modified such that parasitic inductance can be reduced during operation of the electronic apparatus.

It should be noted that, FIG. 1 is a schematic view of the ball pad array 10 with portions thereof being omitted in order to more clearly illustrate the concept of the present disclosure, rather than a view showing the ball pad array being used in practical condition. Furthermore, the ball pad array 10 of the control device 1 further includes signal ball pads, which are not illustrated in FIG. 1 for convenience of explanation.

As shown in FIG. 1, the ground ball pads G1 and the power ball pads P1 of the ball pad array 10 are arranged in the same pad arrangement region 10R. At least a portion of the ground ball pads G1 and at least a portion of the power ball pads P1 are arranged in an alternate manner.

Accordingly, in the embodiment of the present disclosure, the ball pad array 10 at least includes a 2×2 ball pad array 100. The 2×2 ball pad array 100 includes two of the ground ball pads G1 arranged along one diagonal thereof, and two of the power ball pads P1 arranged along the other diagonal thereof.

In the instant embodiment, the number of the ground ball pads G1 is the same as the number of the power ball pads P1. The ground ball pads G1 and the power ball pads P1 are arranged in a plurality of columns along a first direction D1 and arranged in a plurality of rows along a second direction D2. Furthermore, in each column or each row, the ground ball pads G1 and the power ball pads P1 are arranged alternately. To be more specific, in the same column (or row), one of the power ball pads P1 is arranged between two adjacent ground ball pads G1. Accordingly, in the same column (or row), any two of the power ball pads P1 are not adjacent to each other.

Accordingly, for each of the power ball pads P1 in the instant embodiment, one of the ground ball pads G1 is disposed at one of the positions closest to said power ball pad P1. Similarly, for each of the ground ball pads G1, at least one of the power ball pads P1 is disposed at one of the positions closest to said ground ball pad G1. In the instant embodiment, all of the power ball pads P1 and all of the ground ball pads G1 are arranged alternately.

In another embodiment, the numbers of the power ball pads P1 and the ground ball pads G1 can be different. That is to say, the number of the ground ball pads G1 can be greater or smaller than that of the power ball pads P1.

Specifically, when the number of the ground ball pads G1 is greater than that of the power ball pads P1, a portion of the ground ball pads G1 and all of the power ball pads P1 are arranged in the alternate manner. When the number of the ground ball pads G1 is smaller than that of the power ball pads P1, a portion of the power ball pads P1 and all of the ground ball pads G1 are arranged in the alternate manner.

Figure 2:
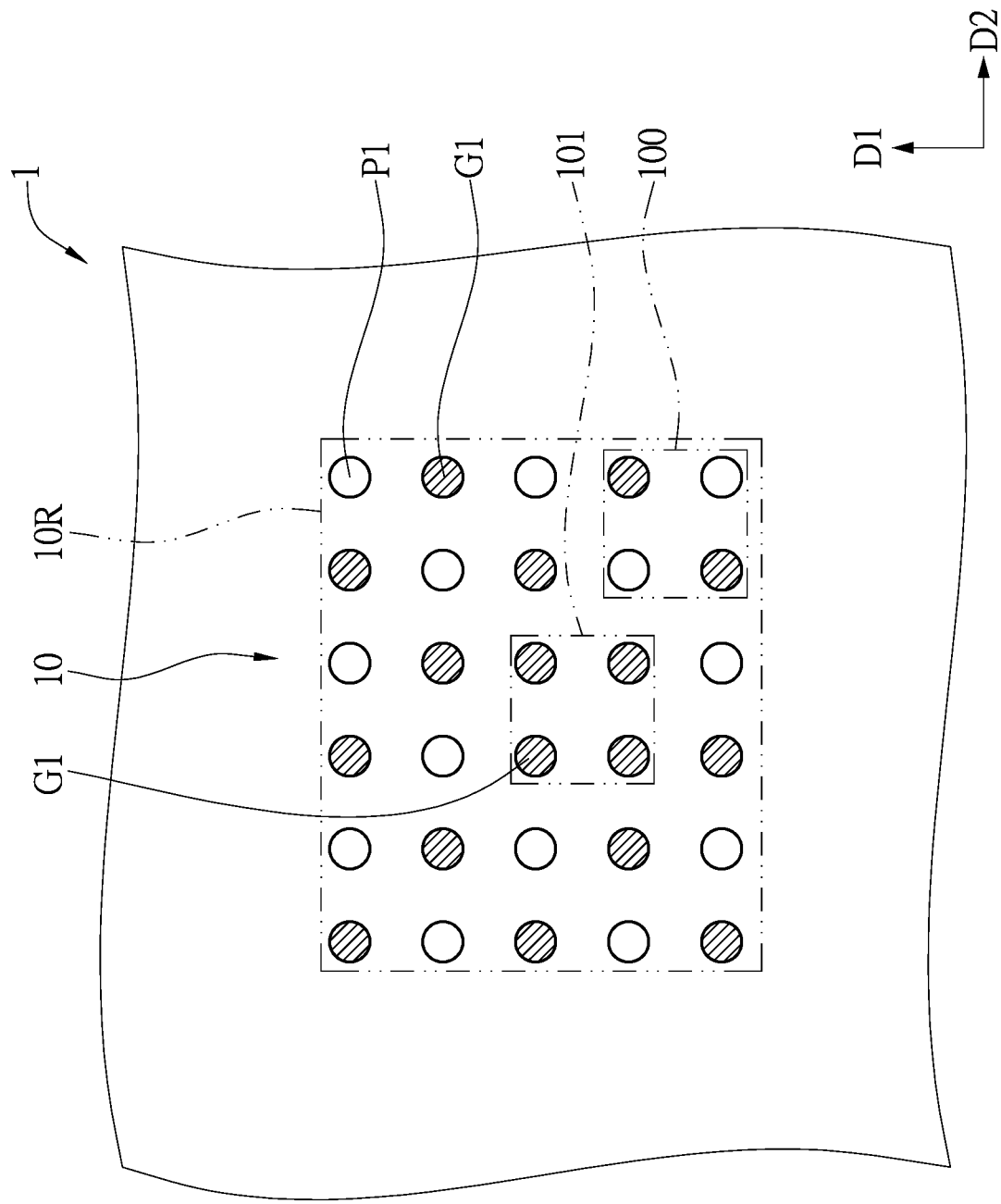
FIG. 2 is a partial view of the bottom of a control device according to another embodiment of the present disclosure.

Reference is made to FIG. 2, which partially shows a view of the bottom of the control device according to another embodiment. The same reference numerals are given to the same components or to components corresponding to those in FIG. 1, and descriptions of the same portions are omitted.

A difference between the instant embodiment and the previous embodiment is that the number of the ground ball pads G1 is greater than that of the power ball pads P1. Accordingly, only a portion of the ground ball pads G1 and all of the power ball pads are arranged in the alternate manner.

As shown in FIG. 2, the ball pad array 10 in the instant embodiment further includes another 2×2 ball pad array 101, which includes two adjacent ground ball pads G1. To be more specific, in the instant embodiment, the 2×2 ball pad array 101 includes four ground ball pads G1 which are adjacent to one another. That is to say, the four ground ball pads G1 in the 2×2 ball pad array 101 are not alternately arranged with any power ball pad P1.

However, the other ground ball pads G1 located at outside of the 2×2 ball pad array 101 are still arranged alternately with the power ball pads. Accordingly, the instant embodiment is provided with the features of "at least a portion of the power ball pads and at least a portion of the ground ball pads are arranged alternately."

Furthermore, the four ground ball pads in the 2×2 ball pad array 101 can be replaced with two adjacent ground ball pads G1 and two adjacent power ball pads P1 or replaced with four power ball pads P1, which do not depart from the spirit of the present disclosure.

Figure 3:
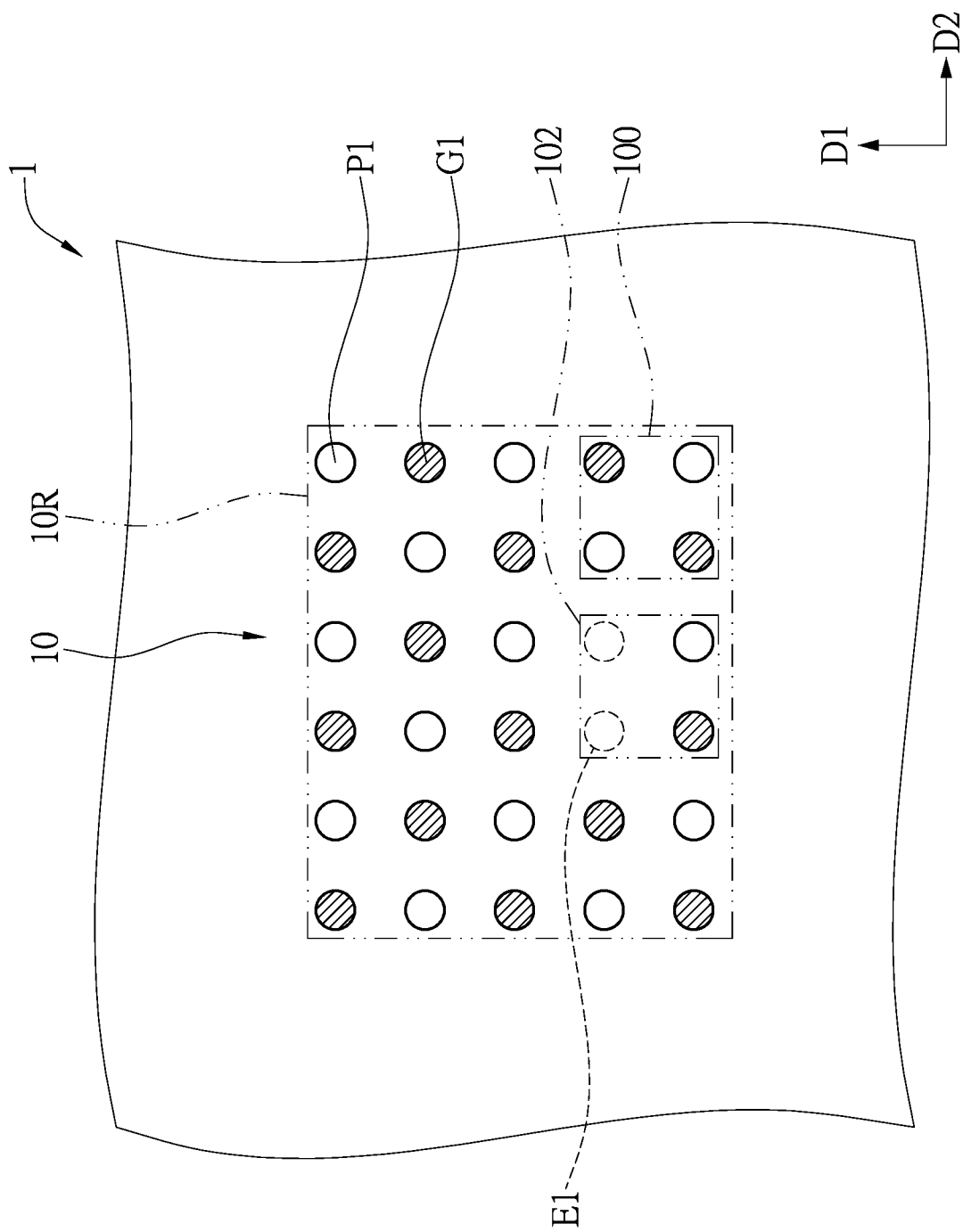
FIG. 3 is a partial view of the bottom of a control device according to yet another embodiment of the present disclosure.

Reference is made to FIG. 3, which shows a view of the bottom of the control device according to yet another embodiment of the present disclosure. In the instant embodiment, the number of the power ball pads G1 is the same as that of the power ball pads P1. The ball pad array 10 further includes at least one pad-free region E1. The pad-free region E1 means a position of the ball pad array 10 without disposing any ground or power ball pad.

That is to say, in the instant embodiment, the ground ball pads G1, the power ball pads P1 and at least one pad-free region E1 are arranged in rows and columns, and the pad-free region E1 is located in one of the rows and columns. In other words, in the instant embodiment, the ball pad array 10 can further includes another 2×2 ball pad array 102, which includes at least one pad-free region E1. In the embodiment shown in FIG. 3, the 2×2 ball pad array 102 includes two pad-free regions E1, one power ball pad P1, and one ground ball pad G1.

However, the number and position of the pad-free region E1 are not limited to the example provided herein, and can be modified according to practical requirements. Furthermore, in the 2×2 ball pad array 102, the power ball pad P1 and the ground ball pad G1 can also be replaced with two power ball pads P1 or two ground ball pads G1.

Based on the embodiments provided in FIG. 1 to FIG. 3, in the ball pad array 10, as long as a portion of the power ball pads P1 and a portion of the ground ball pads G1 are arranged in alternate manner, the control device 1 can satisfy the spirit of the present disclosure.

Figure 4:
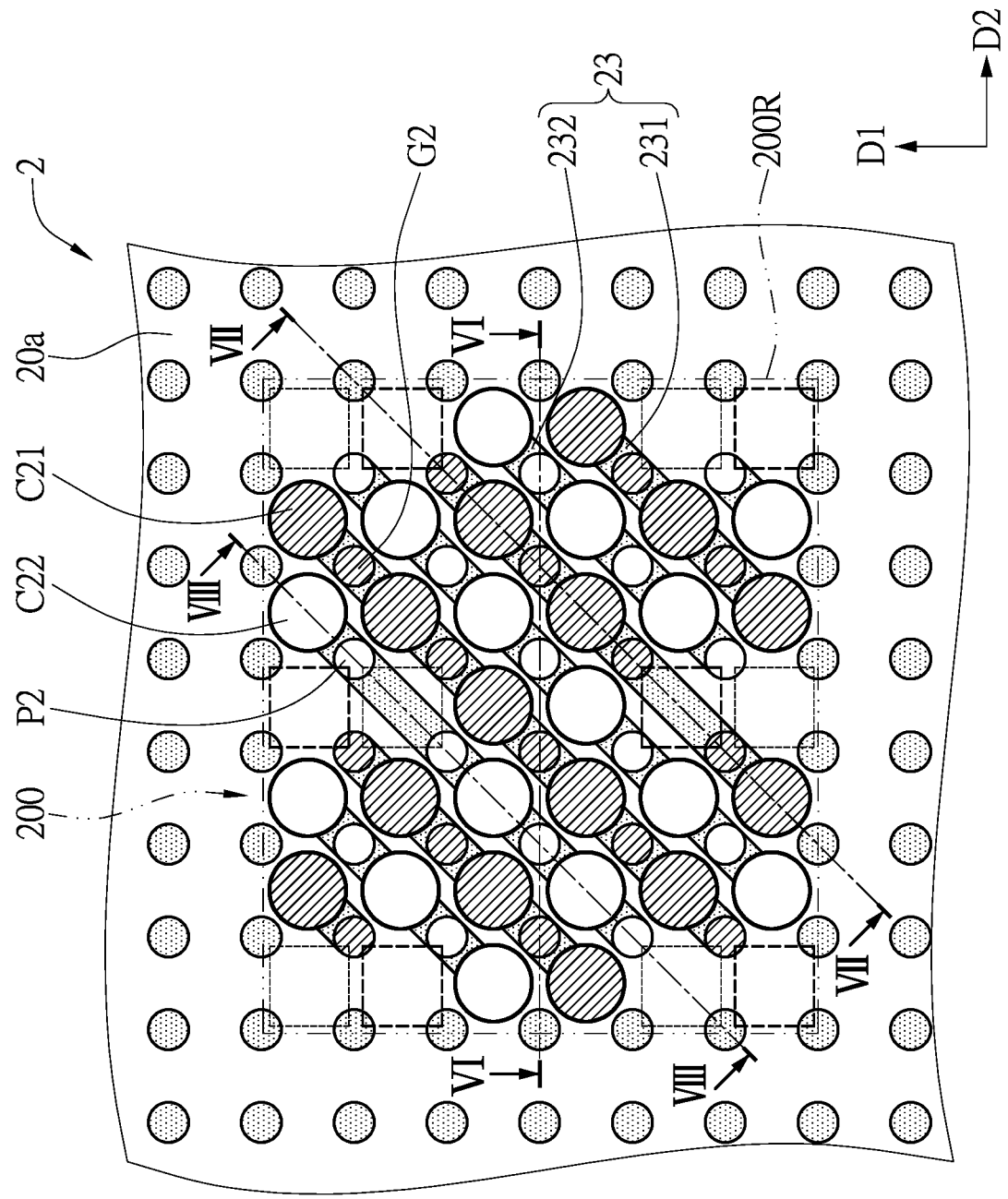
FIG. 4 is a partial top view of a circuit board according to an embodiment of the present disclosure.
Figure 5:
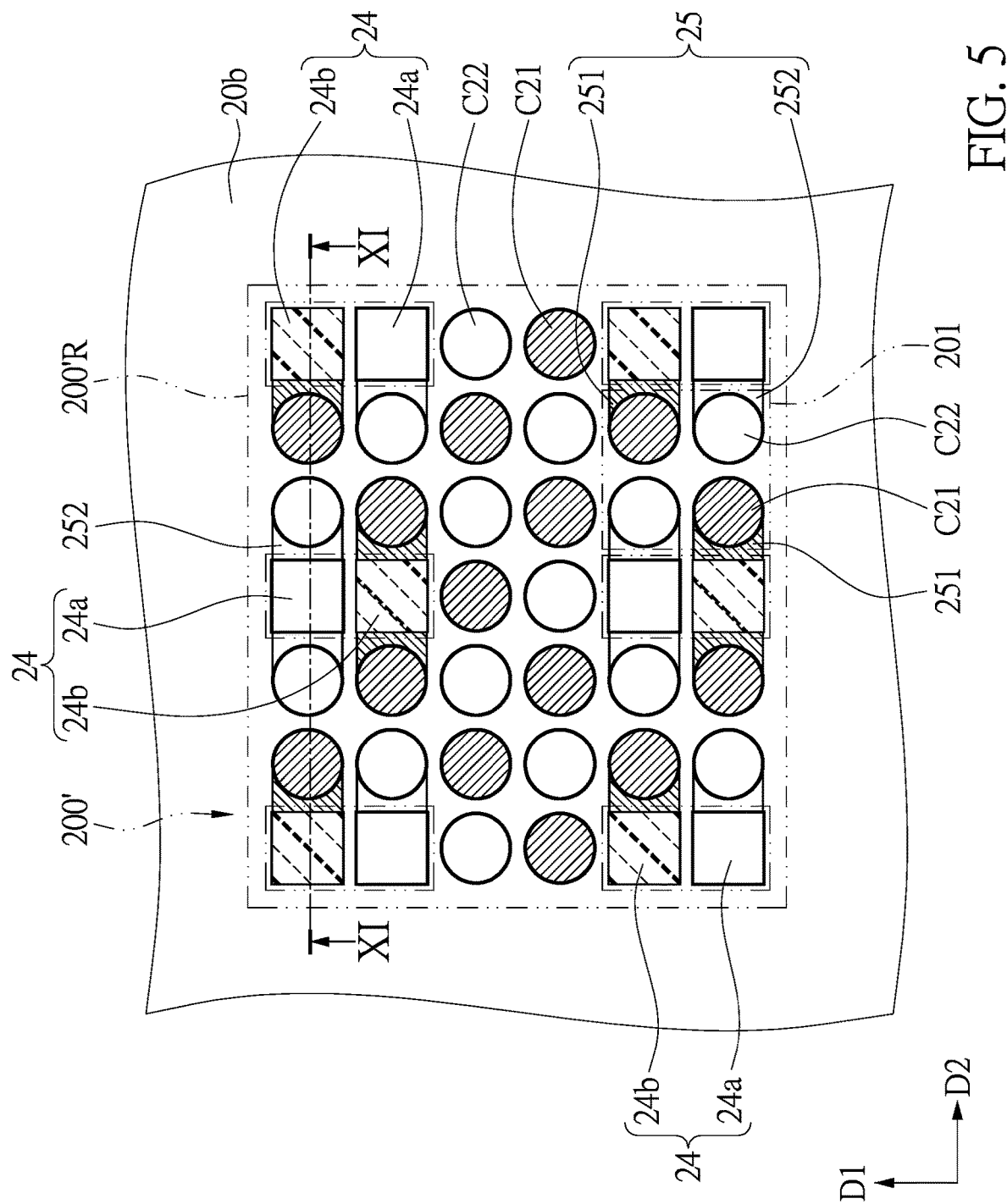
FIG. 5 is a partial view of the bottom of the circuit board of FIG. 4.

Reference is made to FIG. 4, FIG. 5 and FIG. 6. As shown in FIG. 6, the circuit board 2 in the embodiment of the present disclosure includes a laminated board 20. The laminated board 20 has a first surface 20a and a second surface 20b opposite to the first surface 20a. Furthermore, the laminated board 20 includes a ground layer 21 and a power layer 22.

It should be noted that all of the cross-sectional views of the circuit boards 2 merely illustrate the ground layer 21 and the power layer 22 and do not illustrate the other layers of the laminated board 20. In practical, the laminated board 20 is fabricated by laminating a plurality of insulating layers and a plurality of conductive layers. One of the conductive layers can serve as the ground layer 21, and another conductive layer can serve as the power layer 22. The ground layer 21 and the power layer 22 can be insulated from each other by one of the insulating layers.

As shown in FIG. 4, the circuit board 2 further includes a solder pad array 200 disposed corresponding to the ball pad array of the control device 1. In the instant embodiment, the control device 1 can be disposed on the first surface 20a of the laminated board 20. Accordingly, the solder pad array 200 is disposed on the first surface 20a of the laminated board 20.

In the instant embodiment, the solder pad array 200 includes a plurality of power solder pads P2 and a plurality of ground solder pads G2. Each one of the power solder pads P2 can correspond to one of the power ball pads P1 of the ball pad array 10 shown in FIG. 1, respectively. Each one of the ground solder pads G2 can correspond to one of the ground ball pads G1 shown in FIG. 1, respectively.

However, in another embodiment, the arrangements of the power solder pads P2 and the ground solder pads G1 can respectively correspond to the arrangements of the ball pad array shown in FIG. 2. In yet another embodiment, the solder pad array 200 can also have ball-free regions, and the positions of the ball-free regions respectively correspond to the pad-free regions E1 shown in FIG. 3.

Reference is made to FIG. 4. In the instant embodiment, the ground solder pads G2 and the power solder pads P2 are arranged within the first predetermined region 200R on the first surface 20a, and at least a portion of the ground solder pads G2 and at least a portion of the power solder pads P2 are arranged in alternate manner.

Similar to the ball pad array 10 shown in FIG. 1, the solder pad array 200 includes at least one 2×2 solder pad array (not labeled), and the 2×2 solder pad array includes two ground solder pads G2 and two power solder pads P2. Furthermore, the two ground solder pads G2 are arranged along one of the diagonals of the 2×2 solder pad array, while the two power solder pads P2 are arranged along the other one of the diagonals of the 2×2 solder pad array. Accordingly, in the 2×2 solder pad array, each of the power solder pads P2 can be adjacent to one of the ground solder pads G2 in a row or in a column.

To be more specific, in the instant embodiment, the power solder pads P2 and the ground solder pads G2 are jointly arranged in columns and rows, and alternately arranged in each of columns and rows. In other words, in each row or column, one of the ground solder pads G2 is arranged between any two power solder pads P2.

Furthermore, referring to FIG. 4 and FIG. 5, the circuit board 2 according to an embodiment of the present disclosure further includes a conductive via array 200'. The conductive via array 200' includes a plurality of ground conductive vias C21 and a plurality of power conductive vias C22, which pass through the laminated board 20. Each of the power solder pads P2 is electrically connected to the corresponding one of the power conductive vias C22. Each of the ground solder pads G2 is electrically connected to the corresponding one of the ground conductive vias C21.

As shown in FIG. 4, in the instant embodiment, since the power solder pads P2 and the ground solder pads G2 are alternately arranged, the power conductive vias C22 and the ground conductive vias C21 are also arranged alternately so as to be in conjunction with the arrangements of the power solder pads P2 and the ground solder pads G2.

Specifically, referring to FIG. 4, one of the power conductive vias C22 or one of the ground conductive vias C21 is located at a central region of the 2×2 solder pad array. That is to say, one of the power conductive vias C22 or one of the ground conductive vias C21 is disposed among the 2×2 solder pad array that includes two power solder pads P2 and two ground solder pads G2.

Reference is made to FIG. 5. The ground conductive vias C21 and the power conductive vias C22 are jointly located in the second predetermined region 200'R of the second surface 20b. The second predetermined region 200'R and the first determined region 200R at least partially overlap with each other in a thickness direction of the laminated board 20.

In the conductive via array 200', at least two ground conductive vias C21 and two power conductive vias C22 are arranged in a 2×2 conductive via array 201. In the 2×2 conductive via array 201, the two ground conductive vias C21 are arranged along one diagonal, and the power conductive vias C22 are arranged along the other diagonal.

Figure 8:
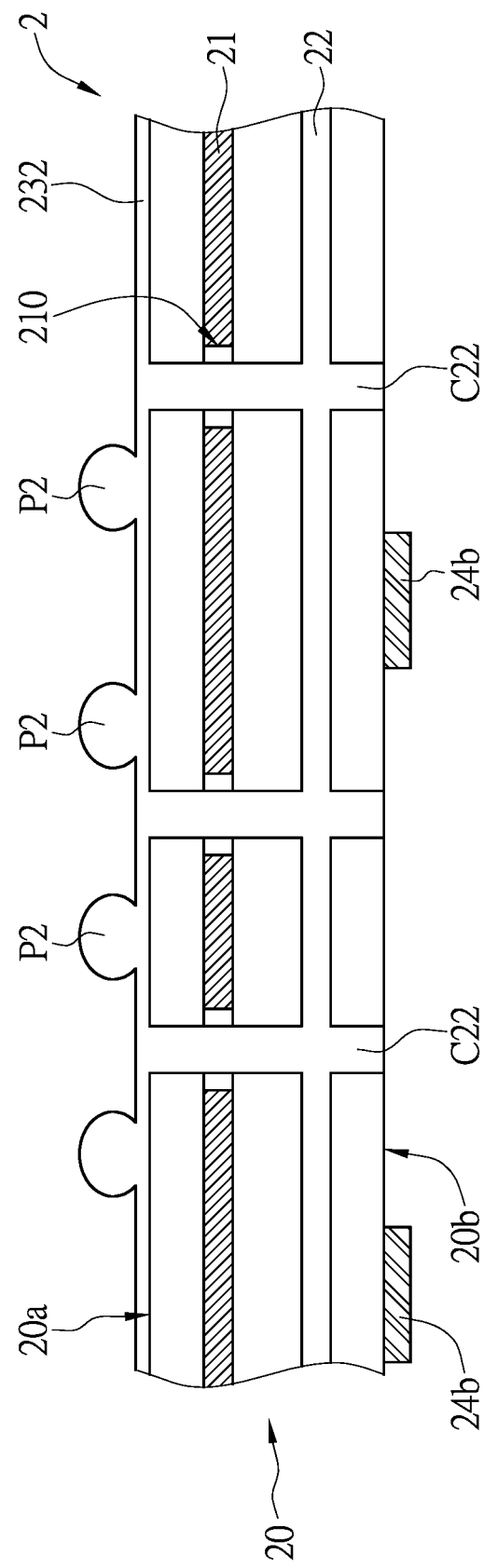
FIG. 8 is a partial cross-sectional view of the circuit board taken along line VIII-VIII of FIG. 4.

Reference is made to FIG. 4, FIG. 7, and FIG. 8. As shown in FIG. 4 and FIG. 7, the circuit board 2 further includes a trace layer 23. The trace layer 23 includes a plurality of front-side ground traces 231 and a plurality of front-side power traces 232.

The front-side ground traces 231 are disposed on the first surface 20a. Each of the front-side ground traces 231 is electrically connected to the corresponding ground solder pads G2 and the corresponding ground conductive vias C21. That is to say, the ground solder pads G2 are electrically connected to the ground layer 21 through the corresponding front-side ground traces 231 and the corresponding ground conductive vias C21.

As shown in FIG. 4 and FIG. 8, the front-side power traces 232 are disposed on the first surface 20a. Each of the front-side power traces 232 is electrically connected to the corresponding power solder pads P2 and the corresponding power conductive vias C22. That is to say, the power solder pads P2 are electrically connected to the power layer 22 through the corresponding front-side power traces 232 and the corresponding power conductive vias C22. Reference is made to FIG. 4. According to the configurations of the power solder pads P2, the ground solder pads G2, the power conductive vias C22, and the ground conductive vias C21, the front-side ground traces 231 and the front-side power traces 232 of the instant embodiment extend along the same direction. Specifically, the front-side ground traces 231 and the front-side power traces 232 disposed on the first surface 20a are inclined with respect to a column direction, i.e., the first direction D1.

It should be noted that since the ground solder pads G2 and the power solder pads P2 are alternately arranged, and the ground conductive vias C21 and the power conductive vias C22 are alternately arranged, the area defined by a current loop that is formed by a set of the power solder pad P2, the power conductive via C22, the ground solder pad G2 and the ground conductive via C21 can be reduced, thereby reducing the parasitic inductance.

Since the parasitic inductance can be reduced, the voltage variation caused by the parasitic inductance and too large transient current variation can also be attenuated, thereby improving the power integrity.

Figure 9:
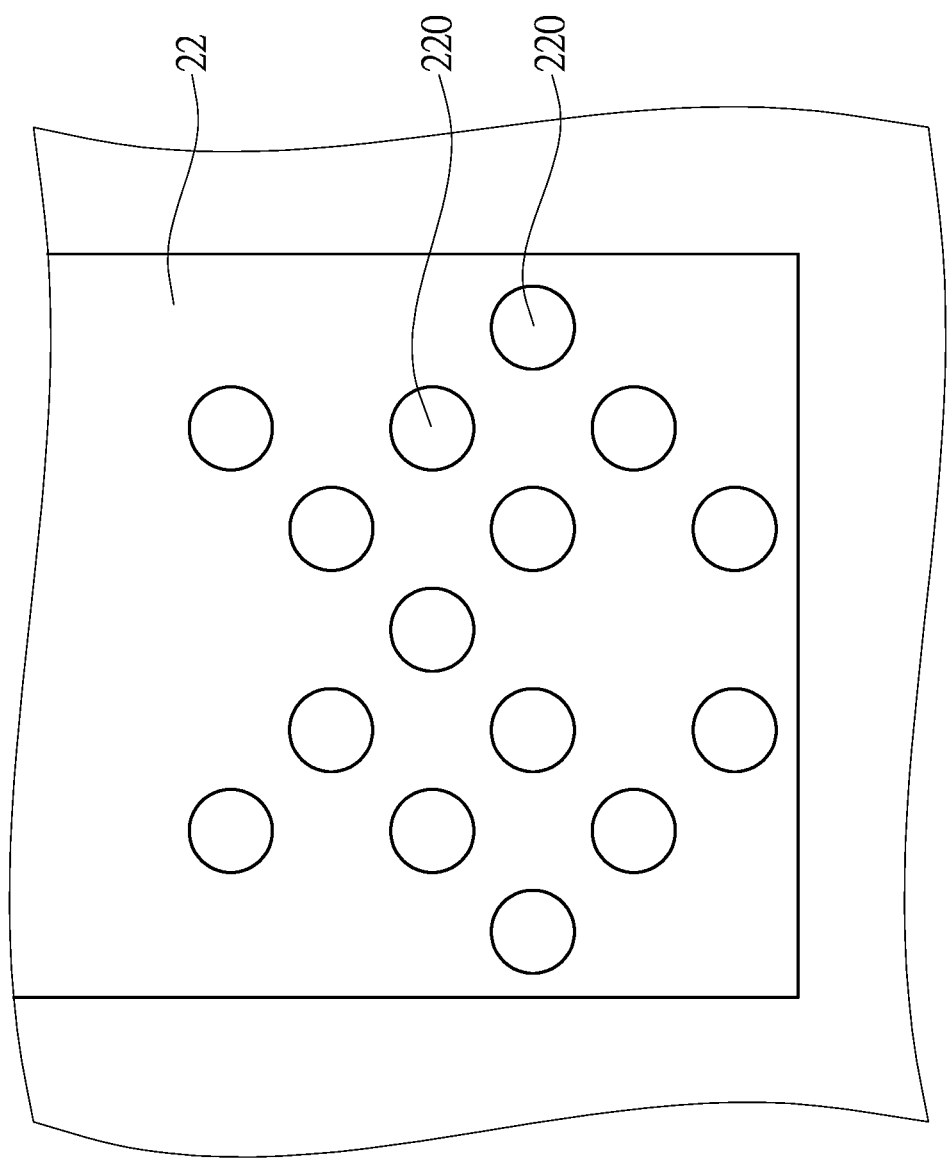
FIG. 9 is a partial top view of a power layer according to an embodiment of the present disclosure.

Furthermore, reference is made to FIG. 7 and FIG. 9, in which FIG. 9 shows a top view of a power layer according to one embodiment of the present disclosure. As shown in FIG. 7, the ground conductive vias C21 pass through the laminated board 20. Accordingly, in order to insulate the power layer 22 from the ground conductive vias C21, the power layer 22 further includes a plurality of first insulating holes 220, which are arranged to respectively correspond to the positions of the ground conductive vias C21. That is to say, each of the ground conductive vias C21 can be insulated from the power layer 22 through the corresponding one of the first insulating holes 220. It should be noted that in FIG. 9, in order to clearly illustrate the first insulating holes 220 corresponding to the ground conductive vias C21, respectively, openings for allowing the power conductive vias C22 to pass therethrough are omitted.

As shown in FIG. 9, a first pattern on the power layer 22 that is formed by the first insulating holes 220 is the same as a ground pattern that is formed by the ground conductive vias on the first surface 20a.

Figure 10:
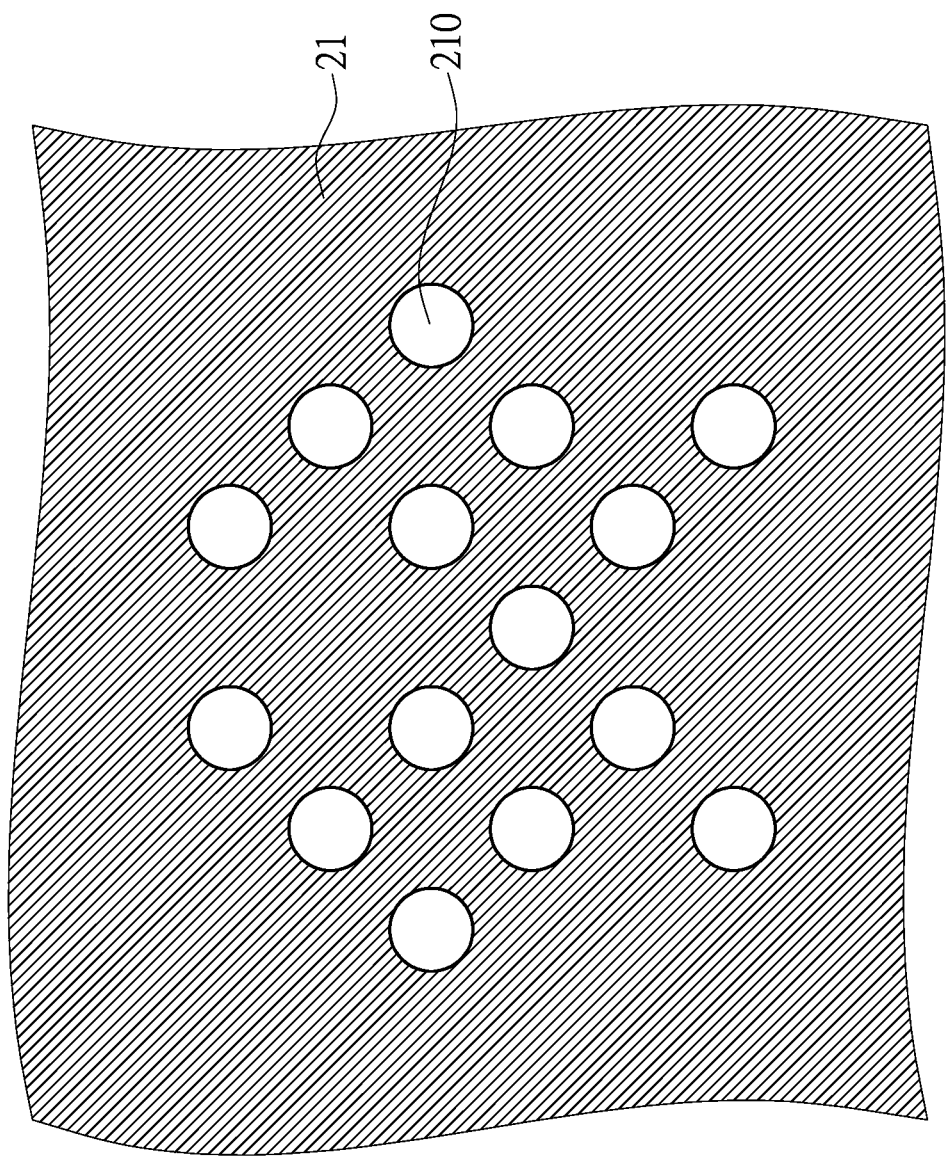
FIG. 10 is a partial top view of a ground layer according to one embodiment of the present disclosure.

Reference is made to FIG. 8 and FIG. 10, in which FIG. 10 is a top view of the ground layer according to one embodiment of the present disclosure. Similarly, as shown in FIG. 8, the ground layer 21 further includes a plurality of second insulating holes 210 so as to be insulated from the power conductive vias C22 passing through the laminated board 20. The second insulating holes 210 are arranged corresponding to the positions of the power conductive vias C22, respectively, such that each of the power conductive vias C22 can be insulated from the ground layer 21 through the corresponding one of the second insulating holes 210.

It should be noted that in FIG. 10, in order to clearly illustrate the second insulating holes 210 corresponding to the power conductive vias C22, respectively, openings for allowing the ground conductive vias C21 to pass therethrough are omitted.

As shown in FIG. 10, the second insulating holes 210 jointly forms a second pattern on the surface of the power layer 22, and the second pattern is the same as the power pattern that is formed by the power conductive vias C22 on the second surface 20b.

It should be noted that although it may be a small increase in the parasitic resistance of the circuit board 2 since the power layer 22 and the ground layer 21 have the insulating holes (the first and second insulating holes 220, 210), the overall operation of the electronic apparatus would not be affected.

Figure 11:
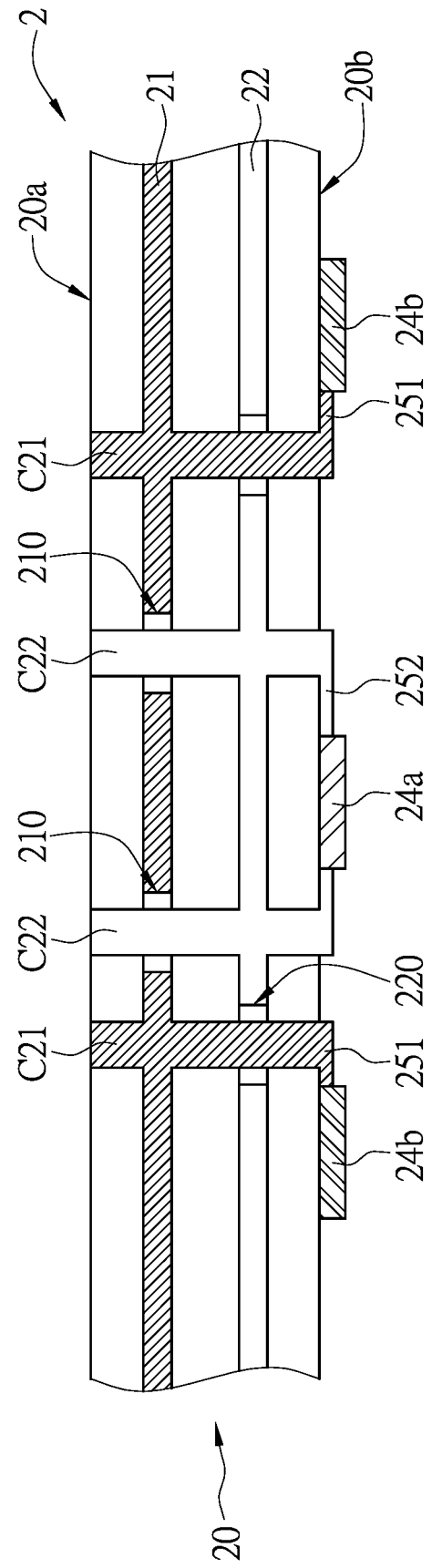
FIG. 11 is a partial cross-sectional view of the circuit board taken along line XI-XI of FIG. 5.

Reference is made to FIG. 5 and FIG. 11. As shown in FIG. 5, the circuit board 2 of the instant embodiment further includes a plurality of contact pad sets 24 which are disposed on the second surface 20b of the laminated board 20. In the instant embodiment, each of the contact pad sets 24 includes an anode contact pad 24a and a cathode contact pad 24b for electrically connecting to a passive element. The aforementioned passive element can be, for example, a multi-layer ceramic capacitor (MLCC).

In the embodiment, each of the anode contact pads 24a is disposed adjacent to corresponding one of the power conductive vias C22, and each of the cathode contact pads 24b is disposed adjacent to corresponding one of the ground conductive vias C21. In one preferred embodiment, two contact pad sets 24 are respectively disposed at two opposite sides of one of the 2×2 conductive via array 201, and the arrangement of the anode contact pad 24a and the cathode contact pad 24b of one of the contact pad sets 24 is opposite to the arrangement of the anode contact pad 24a and the cathode contact pad 24b of the other contact pad set 24.

As such, the power conductive vias C22 and the ground conductive vias C21 can be arranged in alternate manner, such that the area defined by the current loop can be reduced, thereby decreasing the parasitic inductance.

Furthermore, as shown in FIG. 5 and FIG. 11, the circuit board 2 further includes a bottom-side trace layer 25, which includes a plurality of bottom-side ground traces 251 and a plurality of bottom-side power traces 252. Each of the anode contact pads 24a can be electrically connected to the corresponding one of the power conductive vias C22 through the corresponding bottom-side power traces 252. Each of the cathode contact pads 24b can be electrically connected to the corresponding one of the ground conductive vias C21 through the corresponding bottom-side ground traces 251.

When more the anode contact pads 24a and the cathode contact pads 24b of the contact pad sets 24 are disposed, the regions for disposing the ground conductive vias C21 and the power conductive vias C22 are reduced. Accordingly, the number of the contact pad sets 24 can be adjusted according to the number of the passive elements to ensure that the region is large enough to be disposed with the predetermined numbers of ground conductive vias C21 and the power conductive vias C22.

Furthermore, since the ground conductive vias C21 and the power conductive vias C22 are alternately arranged in the embodiments of the present disclosure, the contact pad sets 24 can be scattered across the region without disposing with the ground conductive vias C21 and the power conductive vias C22. When the passive elements are disposed on the circuit board 2, the passive elements are also scattered and disposed among the conductive via array 200' so as to be electrically connected to more numbers of the ground conductive vias C21 and the power conductive vias C22, thereby effectively reducing the impedance during the operation of the control device 1.

In conclusion, one of the advantages of the present disclosure is that by, at least, a technique of "at least a portion of the power pads and at least a portion of the ground pads being arranged in an alternate manner," and "at least a portion of the power conductive vias and at least a portion of the ground conductive vias being arranged in an alternate manner," the parasitic inductance generated in the circuit board can be reduced, thereby avoiding too larger voltage variation resulted from the significant increase of the transient current variation when the control device is operating in high frequency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A circuit board, comprising:
    a laminated board having a first surface and a second surface opposite to the first surface, wherein the laminated board includes a ground layer and a power layer, the power layer being insulated from the ground layer; and
    a solder pad array disposed on the first surface, wherein the solder pad array includes a plurality of power solder pads electrically connected to the power layer and a plurality of ground solder pads electrically connected to the ground layer, the power solder pads and the ground solder pads are arranged in a first predetermined region of the first surface, and a portion of the ground solder pads and a portion of the power solder pads are arranged in an alternate manner; and
    a plurality of contact pad sets disposed on the second surface, wherein the contact pad sets and the solder pad array are respectively located at two opposite sides of the laminated board, each of the contact pad sets includes an anode contact pad and a cathode contact pad, an arrangement of the anode and cathode contact pads of one of the contact pad sets is opposite to an arrangement of the anode and cathode contact pads of another one of the contact pad sets.

2. The circuit board according to claim 1, wherein in the first predetermined region, the number of the power solder pads is different from that of the ground solder pads.

3. The circuit board according to claim 1, wherein the solder pad array includes a 2×2 solder pad array, the 2×2 solder pad array includes two of the ground solder pads arranged along one diagonal thereof, and two of the power solder pads arranged along the other diagonal thereof.

4. The circuit board according to claim 3, further comprising:
    a conductive via array including a plurality of ground conductive vias and a plurality of power conductive vias which pass through the laminated board, wherein the power solder pads are electrically connected to the power layer respectively through the power conductive vias, and the ground solder pads are electrically connected to the ground layer respectively through the ground conductive vias;
    wherein one of the power conductive vias or one of the ground conductive vias is located at a central region of the 2×2 solder pad array.

5. The circuit board according to claim 1, further comprising:
    wherein the anode contact pad is disposed adjacent to the corresponding power conductive via, and the cathode contact pad is disposed adjacent to the corresponding ground conductive via.

6. The circuit board according to claim 5, wherein two ground conductive vias and two power conductive vias are arranged in a 2×2 conductive via array, in which the two ground conductive vias are arranged along one diagonal direction, and the two power conductive vias are arranged along the other diagonal direction, the two contact pad sets are respectively disposed at two opposite sides of the 2×2 conductive via array, the arrangement of the anode contact pad and the cathode contact pad of one of the contact pad sets is opposite to that of the anode contact pad and the cathode contact pad of the other contact pad set.

7. The circuit board according to claim 5, further comprising a plurality of bottom-side ground traces and a plurality of bottom-side power traces disposed on the second surface, wherein each of the anode contact pads is electrically connected to the corresponding power conductive via through the corresponding bottom-side power traces, and each of the cathode contact pads is electrically connected to the corresponding ground conductive via through the corresponding bottom-side ground traces.

8. The circuit board according to claim 1, further comprising:
    a conductive via array including a plurality of ground conductive vias and a plurality of power conductive vias which pass through the laminated board, wherein the power solder pads are electrically connected to the power layer respectively through the power conductive vias, and the ground solder pads are electrically connected to the ground layer respectively through the ground conductive vias;
    wherein the power conductive vias and the ground conductive vias are alternately arranged.

9. The circuit board according to claim 8, further comprising:
    a plurality of front-side ground traces disposed on the first surface, each of the front-side ground traces being electrically connected to the corresponding ground solder pad and the corresponding ground conductive via; and a plurality of front-side power traces disposed on the first surface, each of the front-side power traces being electrically connected to the corresponding power solder pad and the corresponding power conductive via, wherein the front-side power traces and the front-side ground traces extend along the same direction.

10. The circuit board according to claim 8, wherein two of the ground conductive vias and two of the power conductive vias are arranged in a 2×2 conductive via array, the two ground conductive vias are arranged along a diagonal of the 2×2 conductive via array, and the two power conductive vias are arranged along the other diagonal of the 2×2 conductive via array.

11. The circuit board according to claim 8, wherein the ground layer has a plurality of second insulating holes, the second insulating holes are arranged to respectively correspond to positions of the power conductive vias so that the power conductive vias are insulated from the ground layer.

12. The circuit board according to claim 8, wherein the power layer has a plurality of first insulating holes, the first insulating holes are arranged to respectively correspond to positions of the ground conductive vias so that the ground conductive vias are insulated from the power layer.

13. An electronic apparatus, comprising:
a circuit board including:
a laminated board having a first surface and a second surface opposite to the first surface, wherein the laminated board includes a ground layer and a power layer, the power layer being insulated from the ground layer;
a solder pad array disposed on the first surface, wherein the solder pad array includes a plurality of power solder pads electrically connected to the power layer and a plurality of ground solder pads electrically connected to the ground layer, the power solder pads and the ground solder pads are arranged in a first predetermined region of the first surface, a portion of the ground solder pads and a portion of the power solder pads are arranged in an alternate manner; and
a plurality of contact pad sets disposed on the second surface, wherein each of the contact pad sets includes an anode contact pad and a cathode contact pad; and
a control device disposed on the circuit board and including a ball pad array disposed at a bottom thereof, wherein the control device is electrically connected to the circuit board by connecting the ball pad array to the solder pad array, the ball pad array includes a plurality of power ball pads and a plurality of ground ball pads, the power ball pads and the ground ball pads are arranged in the same pad arrangement region, and at least a portion of the ground ball pads and at least a portion of the power ball pads are arranged in an alternate manner;
a plurality of passive elements disposed on the circuit board respectively through the contact pad sets, wherein each of the passive elements and the control device are respectively located at two opposite sides of the laminated board.

14. The electronic apparatus according to claim 13, wherein the number of the ground ball pads is the same as that of the power ball pads, and the ground ball pads and the power ball pads are jointly arranged in a plurality of rows and columns, the ground ball pads and the power ball pads in each row or column are alternately arranged, and each of the ground ball pads is arranged between two adjacent power ball pads.

15. The electronic apparatus according to claim 13, wherein the ball pad array further includes at least one pad-free region, the ground ball pads, the power ball pads and the at least one pad-free region are arranged in a plurality of rows and columns, and the at least one pad-free region is located in one of the rows.

16. The electronic apparatus according to claim 13, wherein the ball pad array at least includes a 2×2 ball pad array, the 2×2 ball pad array includes two of the ground ball pads arranged along one diagonal thereof, and two of the power ball pads arranged along the other diagonal thereof.

17. The electronic apparatus according to claim 13, wherein an arrangement of the anode and cathode contact pads of one of the contact pad sets is opposite to an arrangement of the anode and cathode contact pads of another one of the contact pad sets.

18. The electronic apparatus according to claim 13, wherein the ball pad array at least includes a 2×2 ball pad array, the 2×2 ball pad array at least includes two adjacent ground ball pads or two adjacent power ball pads.

* * * * *